(12) United States Patent
Chen

(10) Patent No.: US 7,675,488 B2
(45) Date of Patent: Mar. 9, 2010

(54) SHIFT REGISTER CIRCUIT

(75) Inventor: Jung-Zone Chen, Hsinhua (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 1132 days.

(21) Appl. No.: 11/186,033

(22) Filed: Jul. 21, 2005

(65) Prior Publication Data
US 2006/0242358 A1 Oct. 26, 2006

(30) Foreign Application Priority Data
Apr. 7, 2005 (TW) .............................. 94111076 A

(51) Int. Cl.
G09G 3/30 (2006.01)
(52) U.S. Cl. ..................... 345/76; 345/100; 345/98; 345/204
(58) Field of Classification Search .................. 345/76, 345/100, 98, 204
See application file for complete search history.

(56) References Cited
U.S. PATENT DOCUMENTS

| 4,254,477 | A | * | 3/1981 | Hsia et al. | ............ 365/200 |
| 5,359,636 | A | * | 10/1994 | Aoyama | ............ 377/73 |
| 5,615,162 | A | * | 3/1997 | Houston | ............ 365/226 |
| 6,701,404 | B1 | * | 3/2004 | Hamre et al. | ............ 710/307 |
| 7,145,977 | B2 | * | 12/2006 | Anand et al. | ............ 377/77 |
| 7,180,323 | B2 | * | 2/2007 | Kim et al. | ............ 324/770 |

* cited by examiner

Primary Examiner—Richard Hjerpe
Assistant Examiner—Leonid Shapiro
(74) Attorney, Agent, or Firm—Thomas, Kayden, Horstemeyer & Risley

(57) ABSTRACT

The present invention discloses a shift register circuit comprising a plurality of shift register units and a bus, wherein the bus couples to each shift register unit. Each shift register unit comprises a shift register, a first selector circuit, and a second selector circuit. The shift register has an input and an output. The first selector circuit is coupled to the input, while the second selector circuit is coupled to the output. The first selector circuit and the second selector circuit selectively couple to the bus or the next shift register unit.

17 Claims, 4 Drawing Sheets

SHIFT REGISTER CIRCUIT

RELATED APPLICATIONS

The present application is based on, and claims priority from, Taiwan Application Ser. No. 94111076, filed Apr. 7, 2005, the disclosure of which is hereby incorporated by reference herein in its entirety.

FIELD OF THE INVENTION

The present invention relates to a shift register circuit, and more particularly, to a shift register circuit with multi-channel functionality.

BACKGROUND OF THE INVENTION

Liquid crystal displays (LCD) have been widely applied in electrical products due to the rapid progress of optical and semiconductor technologies. Moreover, with their advantages of high image quality, compact size, light weight, low driving voltage and low power consumption, LCDs have been introduced into portable computers, personal digital assistants and color televisions and are becoming the mainstream display apparatus.

In liquid crystal displays, a source driver is used to convert a digital signal to an analog voltage to transmit the image signal to the display, so it is also called the data driver. To orderly pass the signals, the source driver comprises a shift register circuit composed of a plurality of shift register units electrically connected in series. The shift register circuit can output an enable signal to enable the digital image signals to orderly load into a corresponding latch. Then, the digital image signals are sent to a digital-to-analog converting circuit from the latch to convert them into analog driving signals to drive the liquid crystal display.

In a conventional shift register circuit, after the shift register circuit is produced, if part of the unused shift register units are to be disabled in multi-channel mode, the unused shift register units need to be bypassed one-by-one with jump lines. This not only increases the size of the chip but also results in late delivery of product when the specification required by customers is not made yet or the specification is altered temporarily.

SUMMARY OF THE INVENTION

Therefore, one objective of the present invention is to provide a shift register circuit in which the jump lines between the shift register units are decreased when the shift register circuit is in multi-channel mode.

Another objective of the present invention is to provide a shift register circuit in which a bus is used in common to bypass the disabled shift register units so that the size of the chip does not need to be increased.

Still another objective of the present invention is to provide a shift register circuit which selectively decides if the driving signal is allowed to pass through a shift register of a shift register unit to let the shift register unit output an enable signal, or instead to bypass the shift register unit to disable the shift register unit.

Still another objective of the present invention is to provide a shift register circuit in which the driving signal can be sent to a shift register unit at a later stage by the bus to bypass unnecessary shift register units, and thus, the number of the channels may be flexibly adjusted to support different resolutions.

According to the aforementioned objectives, the present invention provides a shift register circuit comprising a plurality of shift register units and a bus, wherein the bus couples to each shift register unit. Each shift register unit comprises a shift register, a first selector circuit, and a second selector circuit. The shift register has an input and an output. The first selector circuit is coupled to the input, while the second selector circuit is coupled to the output. The first selector circuit selectively couple to the bus or a former shift register unit and the second selector circuit selectively couple to the bus or a later shift register unit.

According to the preferred embodiment of the present invention, the present invention further comprises at least a control unit to control the first selector circuit. The shift register circuit is a unidirectional shift register circuit or a bidirectional shift register circuit. The shift register may be a delay-type flip flop (DFF). Each of the first selector circuit and the second selector circuit further comprise a switching circuit. The preferred embodiment of the present invention further comprises a third selector circuit coupled between the bus and the first selector circuit, wherein the third selector circuit comprises a switching circuit.

According to another objective, the present invention provides an operation method of a shift register circuit, wherein the shift register circuit comprises a first shift register unit, a second shift register unit, and a third shift register unit, all of which are electrically connected in series and coupled to a bus. The operation method of the shift register circuit comprises the following steps. First, a driving signal is supplied. Then, the electrical connection between the first shift register unit and the second shift register unit is broken. Next, the first shift register unit and the bus are electrically connected. Then, the third shift register unit and the bus are electrically connected.

According to the preferred embodiment of the present invention, the present invention further comprises breaking the electrical connection between the second shift register unit and the third shift register unit; breaking the electrical connection between the second shift register unit and the bus; and turning off the power of a buffer circuit corresponding to the second shift register unit.

According to the objectives, the present invention provides a driving circuit of a display, comprising a shift register circuit, a latch circuit, and a digital-to-analog converting circuit. The latch circuit couples to the shift register circuit, and the digital-to-analog converting circuit couples to the latch circuit. The shift register circuit comprises a plurality of shift register units and a bus coupled to at least three of the shift register units.

According to the preferred embodiment of the present invention, each of the shift register units comprises a shift register, a first selector circuit, and a second selector circuit. The shift register has an input and an output. The first selector circuit is coupled to the input of the shift register, and the second selector circuit is coupled to the output of the shift register. The shift register is a delay-type flip flop. The first selector circuit comprises a switching circuit. The shift register circuit is a unidirectional shift register circuit or a bidirectional shift register circuit. The preferred embodiment of the present invention further comprises a control unit to control the connection between the bus and at least one of the shift register units. The preferred embodiment of the present invention further comprises a selector circuit coupled between the bus and at least one of the shift register units. The selector circuit comprises a switching circuit.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

In order to make the illustration of the present invention more explicit and complete, the following description is stated with reference to FIG. 1a, FIG. 1b, FIG. 2, and FIG. 3. The present invention is preferred to be used in a source driver of a liquid crystal display.

Figure 1A:
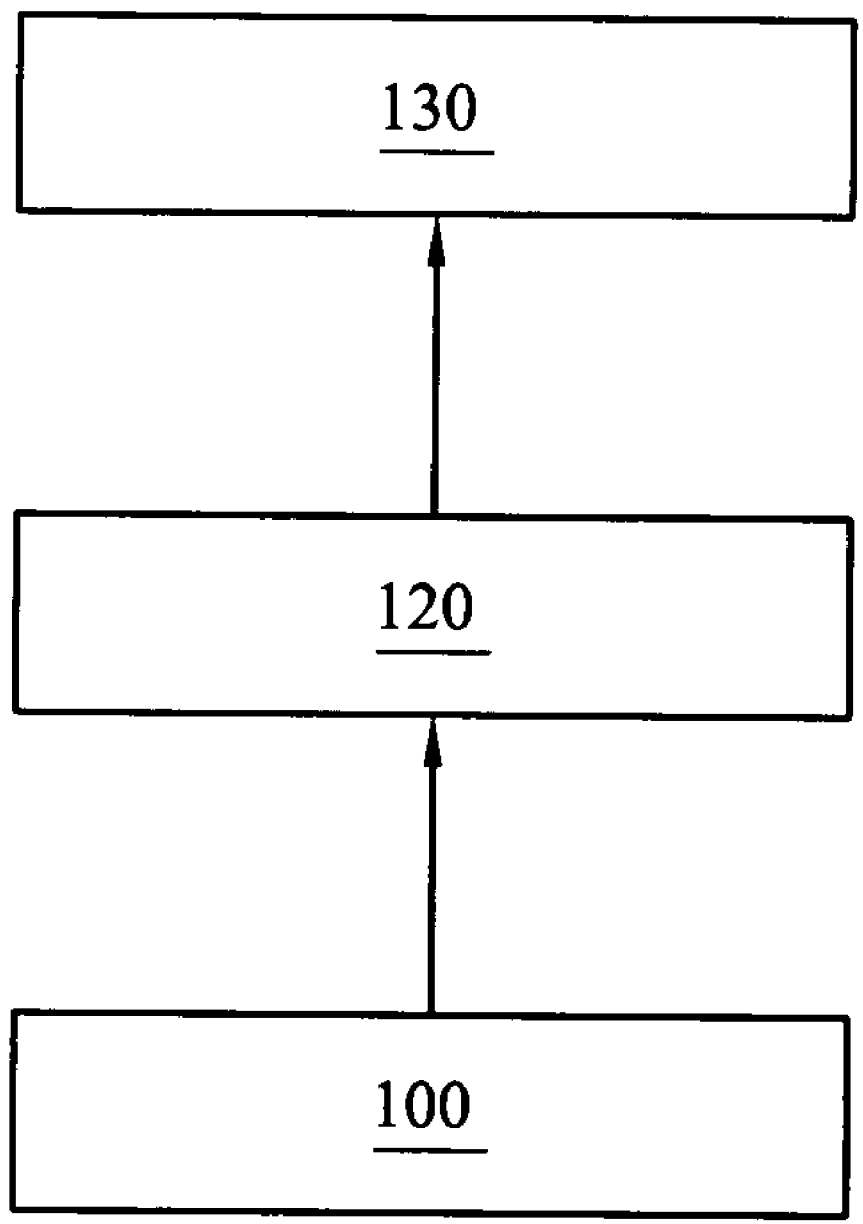
FIG. 1a illustrates the driving circuit of a display according to the preferred embodiment of the present invention.

FIG. 1a illustrates the driving circuit of a display according to the preferred embodiment of the present invention. The driving circuit of the display in the preferred embodiment of the present invention comprises a shift register circuit 100, a latch circuit 120, and a digital-to-analog converting circuit 130. The shift register circuit 100 couples to the latch circuit 120, and the latch circuit 120 couples to the digital-to-analog converting circuit 130. The shift register circuit 100 can output an enable signal to enable the digital image signals to orderly load into the corresponding latch circuit 120. Then, the digital image signals are sent to the digital-to-analog converting circuit 130 from the latch circuit 120 to convert them into analog driving signals to drive the liquid crystal display.

Figure 1B:
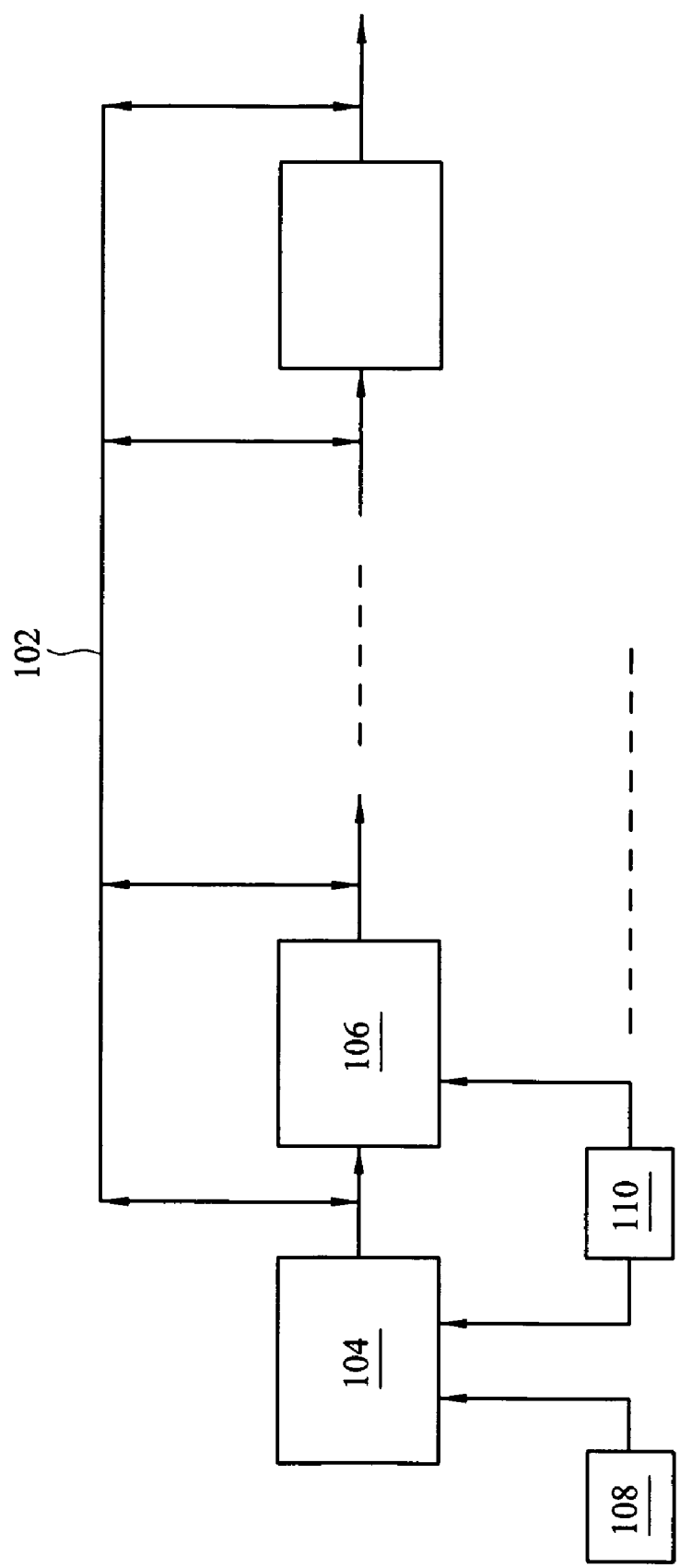
FIG. 1b illustrates a block diagram of the shift register circuit according to the preferred embodiment of the present invention.

FIG. 1b illustrates a block diagram of the shift register circuit according to the preferred embodiment of the present invention. The shift register circuit in the preferred embodiment of the present invention comprises a bus 102, a plurality of shift register units electrically connected in series (denoted as 104 and 106) and a plurality of control units (denoted as 108 and 110) electrically connected to the shift register units. The bus 102 also electrically connects to each shift register unit, and the bus 102 preferably connects to at least three of the shift register units to lay stress on the bypass effect. When the shift register circuit in the preferred embodiment of the present invention disables part of the shift register units not being used in multi-channel mode, each control unit outputs a control signal to each shift register unit, and driving signals which drive each shift register unit bypass the unused shift register units through the bus 102.

Figure 2:
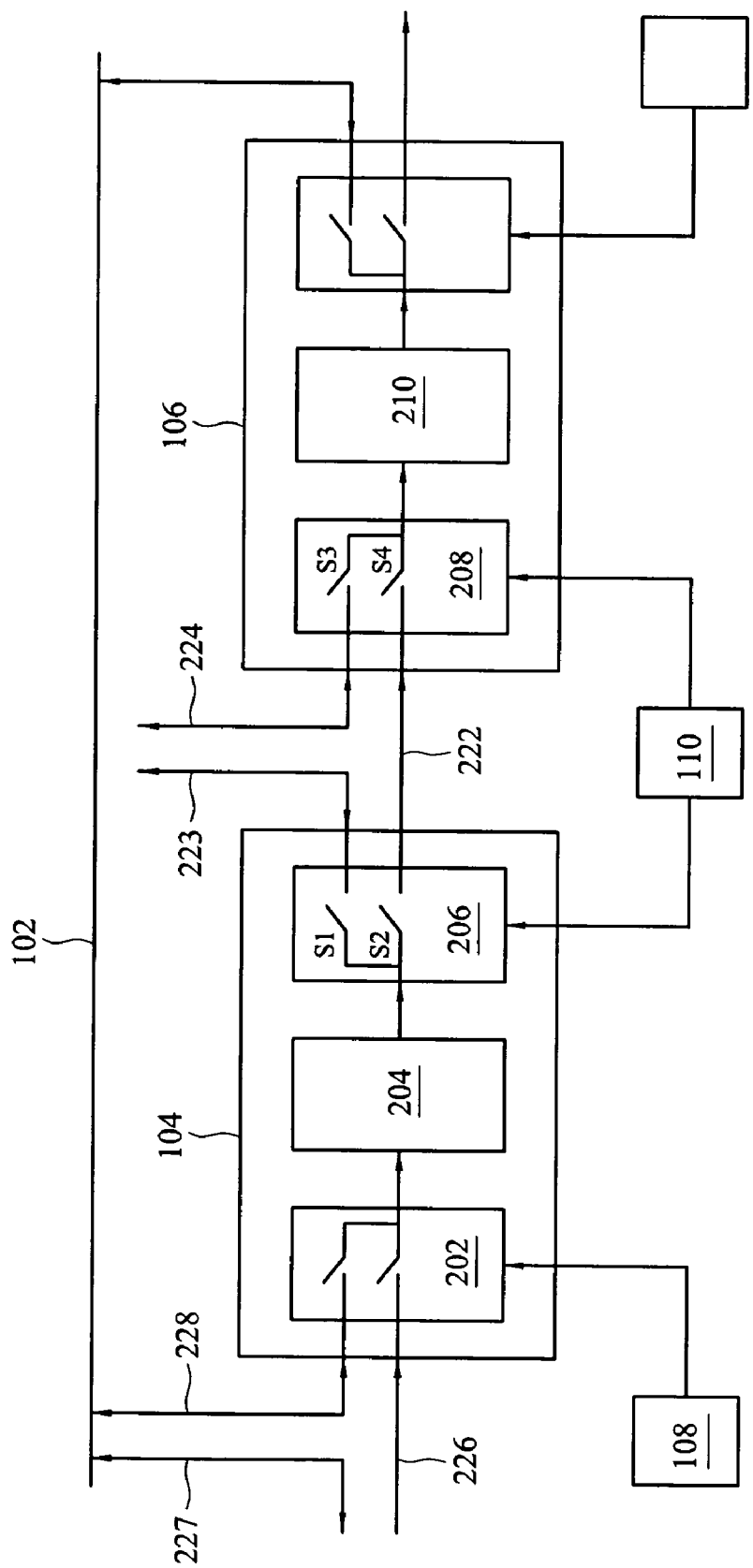
FIG. 2 illustrates a diagram of the shift register unit according to the preferred embodiment of the present invention.

FIG. 2 illustrates a diagram of the shift register unit according to the preferred embodiment of the present invention. The shift register unit 104 comprises an input selector circuit 202, a shift register 204, and an output selector circuit 206. The input selector circuit 202 electrically connects to the input of the shift register 204, and the output of the shift register 204 electrically connects to the output selector circuit 206. Furthermore, the control unit 108 locates between the shift register unit 104 and the shift register unit of the former stage, and electrically connects to the input selector circuit 202 of the shift register unit 104 and the output selector circuit of the shift register unit of the former stage. The control unit 110 locates between the shift register unit 104 and the shift register unit 106, and electrically connects to the output selector circuit 206 of the shift register unit 104 and the input selector circuit 208 of the shift register unit 106. The control unit 108 and the control unit 110 output control signals to the input selector circuits and the output selector circuits to control the switching of the selector circuits and further to determine whether to use the shift register unit or not. In other words, the control unit controls the switching of the selector circuits to decide whether to use or disable the shift register unit to enable the necessary number of channels. The following describes in detail the operation condition of the shift register circuit in the preferred embodiment of the present invention.

In FIG. 2, after deciding the number of the channels needed, the control unit 110 outputs a control signal to the output selector circuit 206 and the input selector circuit 208 to decide if the driving signal which drives the shift register unit passes through the shift register by controlling the switch S1, the switch S2, the switch S3 and the switch S4. For example, if the shift register unit 106 is needed, the control unit 110 controls the output selector circuit 206 of the shift register unit 104 and the input selector circuit 208 of the shift register unit 106. By switching off the switch S1 and the switch S3 and switching on the switch S2 and the switch S4, a normal path 222 is chosen to pass the driving signal into the shift register unit 106 and further into the shift register in the shift register unit 106.

Contrarily, if the shift register unit 106 is not used, the control unit 110 controls the output selector circuit 206 of the shift register unit 104 and the input selector circuit 208 of the shift register unit 106. By switching on the switch S1 and switching off the switch S2, the switch S3 and the switch S4, a bypass path 223 is chosen to send the driving signal to the bus 102 to bypass the shift register unit 106. When bypassing the shift register unit 106, since the driving signal is not input to the shift register unit 106, the shift register unit 106 does not output the enable signal to the corresponding latch. Therefore, the digital image signal is not loaded and the number of channels is decreased. Meanwhile, the power of the shift register units and the corresponding circuit in the channels (not shown) may be turned off, such as by turning off the power of the output buffer, to save power.

Moreover, if the shift register unit 104 and the shift register unit 106 are used, the control unit 108 controls the input selector circuit 202 and the output selector circuit of the former stage to choose the normal path 226 to pass the driving signal into the shift register 204 through the input selector circuit 202. Then, the control unit 110 controls the output selector circuit 206 and the input selector circuit 208 to choose the normal path 222 to pass the driving signal into the shift register 210 in the shift register unit 106.

Similarly, if the shift register unit 104 is used but the shift register unit 106 is not used, the control unit 108 controls the input selector circuit 202 and the output selector circuit of the former stage to choose the normal path 226 to pass the driving signal into the shift register 204 through the input selector circuit 202, but the control unit 110 controls the output selector circuit 206 and the input selector circuit 208 to choose the bypass path 224 to make the driving signal bypass the shift register unit 106 and to send the driving signal to the shift register unit in the later stage of the shift register unit 106.

Contrarily, if the shift register unit 104 is not used but the shift register unit 106 is used, the control unit 108 controls the input selector circuit 202 and the output selector circuit of the former stage to choose the bypass path 227 to send the driving signal to the bus 102 to bypass the shift register unit 104. Then, the control unit 110 controls the output selector circuit 206 and the input selector circuit 208 to switch on the switch S3 and switch off the switch S1, the switch S2 and the switch S4 to choose the bypass path 224 to pass the driving signal into the shift register unit 106. Similarly, the bypass paths may be chosen to bypass both of the shift register unit 104 and the shift register unit 106.

Figure 3:
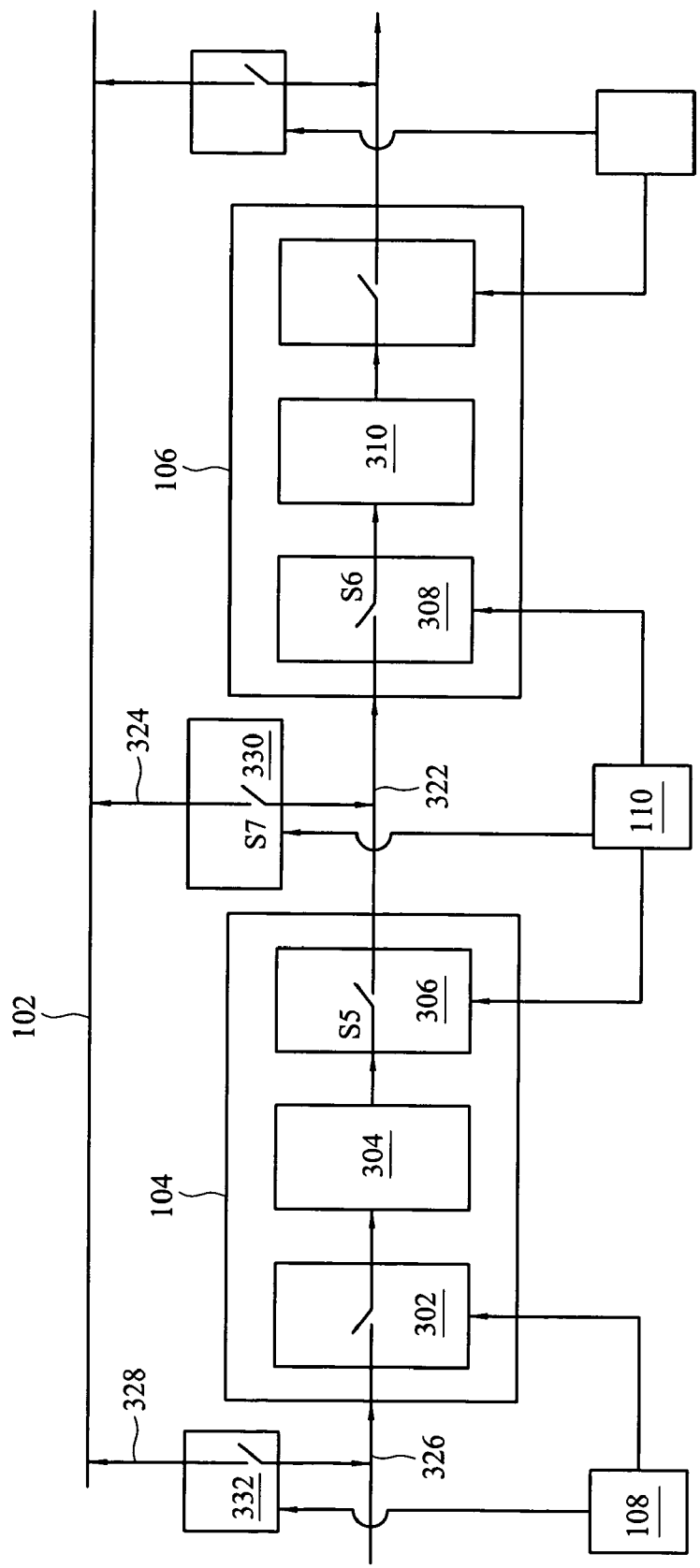
FIG. 3 illustrates a diagram of the shift register unit according to another preferred embodiment of the present invention.

Finally, reference is made to FIG. 3, which illustrates a diagram of the shift register unit according to another preferred embodiment of the present invention and which is a substitution for FIG. 2. As shown in FIG. 3, the shift register unit 104 in the preferred embodiment of the present invention comprises an input selector circuit 302, a shift register 304, and an output selector circuit 306. The input selector circuit 302 electrically connects to the input of the shift register 304, and the output of the shift register 304 electrically connects to the output selector circuit 306. Furthermore, the control unit 108 locates between the shift register unit 104 and the shift register unit of the former stage, and electrically connects to the input selector circuit 302 of the shift register unit 104, the output selector circuit of the shift register unit of the former stage, and a bypass selector circuit. The control unit 110 locates between the shift register unit 104 and the shift register unit 106, and electrically connects to the output selector circuit 306 of the shift register unit 104, the input selector circuit 308 of the shift register unit 106, and the bypass selector circuit 330. The bypass selector circuit 330 electrically connects the bus 102 to the output selector circuit 306 and the input selector circuit 308. The control unit 108 and the control unit 110 output control signals to the input selector circuits, the output selector circuits, and the bypass selector circuits to control the switching of the selector circuits and further to determine whether to use the shift register unit or not. In other words, the control unit controls the switching of the selector circuits to decide whether to use or disable the shift register unit to enable the necessary number of channels. The following describes in detail the operation condition of the shift register circuit in another preferred embodiment of the present invention.

In FIG. 3, after deciding the number of channels needed, the control unit 110 outputs a control signal to the output selector circuit 306, the input selector circuit 308, and the bypass selector circuit 330 to decide if the driving signal which drives the shift register unit passes through the shift register by controlling the switch S5, the switch S6 and the switch S7. For example, if the shift register unit 106 is needed, the control unit 110 controls the output selector circuit 306 of the shift register unit 104, the input selector circuit 308 of the shift register unit 106, and the bypass selector circuit 330. By switching off the switch S7 and switching on the switch S5 and the switch S6, a normal path 322 is chosen to pass the driving signal into the shift register unit 106 and further into the shift register in the shift register unit 106. Contrarily, if the shift register unit 106 is not used, the control unit 110 controls the output selector circuit 306 of the shift register unit 104, the input selector circuit 308 of the shift register unit 106, and the bypass selector circuit 330. By switching on the switch S5 and the switch S7 and switching off the switch S6, a bypass path 324 is chosen to send the driving signal to the bus 102 to bypass the shift register unit 106.

If the shift register unit 104 and the shift register unit 106 are used, the control unit 108 controls the input selector circuit 302, the output selector circuit of the former stage, and the bypass selector circuit 332 to choose the normal path 326 to pass the driving signal into the shift register 304 through the input selector circuit 302. Then, the control unit 110 controls the output selector circuit 306 and the input selector circuit 308 to choose the normal path 322 to pass the driving signal into the shift register 310 in the shift register unit 106.

Contrarily, if the shift register unit 104 is not used but the shift register unit 106 is used, the control unit 108 controls the input selector circuit 302, the output selector circuit of the former stage, and the bypass selector circuit 332 to choose the bypass path 328 to send the driving signal to the bus 102 to bypass the shift register unit 104. Then, the control unit 110 controls the output selector circuit 306, the input selector circuit 308, and the bypass selector circuit 330 to switch on the switch S6 and the switch S7 and switch off the switch S5, to choose the bypass path 324 to pass the driving signal into the shift register unit 106. Similarly, the bypass paths may be chosen to bypass both of the shift register unit 104 and the shift register unit 106.

Hence, a feature of the present invention is that the shift register circuit in the preferred embodiment of the present invention has a bus electrically connected to each of the shift register units so that the driving signal can be sent to the shift register unit at a later stage by the bus to bypass the shift register units not needed.

Another feature of the present invention is that there are selector circuits in both the input and output of the shift register circuit in the preferred embodiment of the present invention, and thus, the driving signal can be sent to the bus via the bypass path and to the shift register unit at a later stage, or the driving signal can be sent to the shift register unit at a later stage via the normal path.

In the preferred embodiment of the present invention, the selector circuit is a switching circuit. The shift register is a delay-type flip flop (DFF). The shift register circuit is a unidirectional shift register circuit or a bidirectional shift register circuit to support the application for left shifting or right shifting.

According to the aforementioned description, one advantage of the present invention is that the shift register circuit of the present invention uses a bus in common to bypass the disabled shift register units instead of using the jump lines one-by-one, and therefore, the size of the chip does not need to be increased.

According to the aforementioned description, yet another advantage of the present invention is that the shift register circuit of the present invention selectively decides if the driving signal is allowed to pass through the shift register of the shift register unit to let the shift register unit output an enable signal, or to bypass the shift register unit to disable the shift register unit.

According to the aforementioned description, still another advantage of the present invention is that the shift register circuit of the present invention can send the driving signal to the shift register unit at a later stage via the bus to bypass the shift register units not needed so that the number of channels may be flexibly adjusted to support many kinds of products with different resolutions, and thus, the goods are able to be supplied on time even when the resolution specification required by the customers is not made yet or the number of channels needed has a great variety.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A shift register circuit, comprising:
a bus; and
a plurality of shift register units, wherein each of the shift register units comprises:
a shift register, having an input and an output;
a first selector circuit, coupled to the input of the shift register and coupled to the bus; and
a second selector circuit, coupled to the output of the shift register and coupled to the bus; and
wherein if a shift register unit is to be used, the first selector circuit of the shift register unit is connected with a second selector circuit of a former shift register unit, and the second selector circuit of the shift register unit is connected with a first selector circuit of the later shift register unit;
wherein if a shift register unit is to be bypassed, the first selector circuit of the shift register unit is disconnected with the bus and a second selector circuit of a former shift register unit , and the second selector circuit of the shift register unit is disconnected with the bus and a first selector circuit of a later shift register unit, wherein the second selector circuit of the former shift register unit is connected to the bus and the first selector circuit of the later shift register unit is connected to the bus to make the former shift register unit connect with the later shift register unit through the bus.

2. The shift register circuit according to claim 1, further comprising at least a control unit to control the first selector circuit.

3. The shift register circuit according to claim 1, wherein the shift register circuit is a unidirectional shift register circuit or a bidirectional shift register circuit.

4. The shift register circuit according to claim 1, wherein the shift register is a delay-type flip flop (DFF).

5. The shift register circuit according to claim 1, wherein the first selector circuit comprises a switching circuit.

6. The shift register circuit according to claim 1, wherein the second selector circuit comprises a switching circuit.

7. The shift register circuit according to claim 1, further comprising a third selector circuit coupled between the bus and the first selector circuit.

8. The shift register circuit according to claim 1, wherein the third selector circuit comprises a switching circuit.

9. An operation method of a shift register circuit, wherein the shift register circuit comprises a first shift register unit, a second shift register unit, and a third shift register unit electrically connected in series and coupled to a bus, respectively, the operation method of the shift register circuit comprising:
supplying a driving signal;
breaking the electrical connection between the first shift register unit and the second shift register unit and the electrical connection between the second shift register unit and the third shift register unit to make the first shift register unit disconnect with the second shift register unit and the third shift register unit disconnect with the second shift register unit;
breaking the electrical connection between the second shift register unit and the bus to make the second shift register unit disconnect with the bus;
electrically connecting the first shift register unit and the bus, and the third shift register unit and the bus to make the first shift register unit connect with the third shift register unit through the bus; and
turning off the power of a buffer circuit corresponding to the second shift register unit.

10. A driving circuit of a display, comprising:
a bus; and
a shift register circuit, comprising:
a plurality of shift register units, each shift register unit comprising:
a shift register, having an input and an output;
a first selector circuit, coupled to the input of the shift register and coupled to the bus; and
a second selector circuit, coupled to the output of the shift register and coupled to the bus;
a latch circuit, coupled to the shift register circuit;
a digital-to-analog converting circuit, coupled to the latch circuit; and
a plurality of buffer circuits connecting to the digital-to-analog converting circuit;
wherein if a shift register unit is to be bypassed, the first selector circuit of the shift register unit is disconnected with the bus and a second selector circuit of a former shift register unit, and the second selector circuit of the shift register unit is disconnected with the bus and a first selector circuit of a later shift register unit, wherein the second selector circuit of the former shift register unit is connected to the bus and the first selector circuit of the later shift register unit is connected to the bus to make the former shift register unit connect with the later shift register unit through the bus 11. The driving circuit according to claim 10, wherein the shift register is a delay-type flip flop.

12. The driving circuit according to claim 10, wherein the first selector circuit comprises a switching circuit.

13. The driving circuit according to claim 10, further comprising a control unit to control the connection between the bus and at least one of the shift register units.

14. The driving circuit according to claim 10, wherein the shift register circuit is a unidirectional shift register circuit or a bidirectional shift register circuit.

15. The driving circuit according to claim 10, further comprising a selector circuit coupled between the bus and at least one of the shift register units.

16. The driving circuit according to claim 15, wherein the selector circuit comprises a switching circuit.

17. The driving circuit according to claim 10, wherein the power of the buffer circuit corresponding to the by-passed shift register unit is turned off.

* * * * *